(12) United States Patent
Lee et al.

(10) Patent No.: US 8,487,030 B2
(45) Date of Patent: Jul. 16, 2013

(54) ORGANIC-INORGANIC HYBRID COMPOSITION AND IMAGE SENSOR

(75) Inventors: Chang-Min Lee, Uiwang-si (KR); Jae-Hyun Kim, Uiwang-si (KR); Eui-June Jeong, Uiwang-si (KR); Kil-Sung Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 472 days.

(21) Appl. No.: 12/770,920

(22) Filed: Apr. 30, 2010

(65) Prior Publication Data

US 2011/0006386 A1   Jan. 13, 2011

(30) Foreign Application Priority Data

Jul. 9, 2009   (KR) .................... 10-2009-0062648

(51) Int. Cl.
 *C08K 3/18* (2006.01)
(52) U.S. Cl.
 USPC .................... 524/430; 524/432; 524/497
(58) Field of Classification Search
 USPC .......................... 524/432, 430, 497
 See application file for complete search history.

(56) References Cited

U.S. PATENT DOCUMENTS

| | | | |
|---|---|---|---|
| 5,362,697 A | 11/1994 | Fung et al. | |
| 5,631,703 A | 5/1997 | Hamilton, Jr. et al. | |
| 5,854,091 A | 12/1998 | Back et al. | |
| 6,242,730 B1 | 6/2001 | Lin et al. | |
| 6,512,220 B1 | 1/2003 | Park | |
| 7,167,629 B2 | 1/2007 | Mune et al. | |
| 7,851,789 B2 | 12/2010 | Lee et al. | |
| 7,972,890 B2 | 7/2011 | Oh et al. | |
| 8,003,429 B2 | 8/2011 | Lee et al. | |
| 8,187,905 B2 | 5/2012 | Yin et al. | |
| 2001/0044166 A1 | 11/2001 | Park et al. | |
| 2006/0147703 A1 | 7/2006 | Walker et al. | |
| 2006/0180885 A1 | 8/2006 | Rhodes | |
| 2006/0255463 A1 | 11/2006 | Won | |
| 2006/0280878 A1 | 12/2006 | Suezaki et al. | |
| 2007/0210395 A1 | 9/2007 | Maruyama et al. | |
| 2008/0158675 A1* | 7/2008 | Fukushige et al. | 359/500 |
| 2008/0161444 A1 | 7/2008 | Hayashi et al. | |
| 2008/0230864 A1 | 9/2008 | Lee | |
| 2009/0130792 A1 | 5/2009 | Lee et al. | |
| 2009/0146236 A1 | 6/2009 | Lee et al. | |
| 2009/0208854 A1 | 8/2009 | Choi et al. | |
| 2011/0006386 A1 | 1/2011 | Lee et al. | |
| 2012/0007200 A1 | 1/2012 | Lee et al. | |

FOREIGN PATENT DOCUMENTS

| | | |
|---|---|---|
| JP | 05-070528 | 3/1993 |
| JP | 05-148411 | 6/1993 |
| JP | 05-204180 | 8/1993 |
| JP | 7-172032 | 7/1995 |
| JP | 7-235655 | 9/1995 |
| JP | 10-066094 | 3/1998 |
| JP | 11-354763 | 12/1999 |
| JP | 2001-196366 A | 7/2001 |
| JP | 2004-341121 | 12/2004 |
| JP | 2005-278213 | 10/2005 |
| JP | 2006-128383 A | 5/2006 |
| JP | 2008-081726 A | 4/2008 |
| JP | 2008-133379 A | 6/2008 |
| JP | 2008-294058 | 12/2008 |
| KR | 1998-056215 B1 | 5/1999 |
| KR | 10-2001-0061335 A | 7/2001 |
| KR | 2002-039125 A | 5/2002 |
| KR | 2003-002899 A | 1/2003 |
| KR | 2003-056596 A | 7/2003 |
| KR | 1020030075890 A | 9/2003 |
| KR | 1020050077345 A | 8/2005 |
| KR | 2006-0052171 A | 5/2006 |
| KR | 10-2006-0077973 | 7/2006 |
| KR | 1020070007016 A | 1/2007 |
| KR | 1020070021966 A | 2/2007 |
| KR | 2007-0033748 A | 3/2007 |
| KR | 100793946 A | 1/2008 |
| KR | 1020080100025 A | 11/2008 |
| KR | 10-2009-0046101 A | 5/2009 |
| KR | 10-2010-0112449 A | 10/2010 |
| TW | 200633196 | 9/2006 |
| TW | 200643617 | 12/2006 |
| WO | 2007/105627 A1 | 9/2007 |
| WO | 20101117123 A2 | 10/2010 |

OTHER PUBLICATIONS

International Search Report and Written Opinion in commonly owned International Application No. PCT/KR2009/007055 dated May 2, 2011, pp. 1-10.
Taiwanese Search Report in counterpart Taiwanese Application No. 98142271 dated Nov. 20, 2012, pp. 1.
Taiwanese Search Report in commonly owned Taiwanese Applicatiion No. 98142274 dated Jan. 4, 2013, pp.1.

* cited by examiner

*Primary Examiner* — Edward Cain (74) *Attorney, Agent, or Firm* — Summa, Additon & Ashe, P.A.

(57) ABSTRACT

Disclosed are an organic-inorganic hybrid composition including a fluorene-based monomer, an inorganic particle, an initiator, and a solvent, and an image sensor made using the same. The organic-inorganic hybrid composition can have a high refractive index and excellent transmittance to minimize light loss, and the image sensor produced using the same may transport a greater amount of light to a photodiode. Accordingly, it is possible to accomplish a high resolution image sensor having improved sensitivity.

9 Claims, 1 Drawing Sheet

ORGANIC-INORGANIC HYBRID COMPOSITION AND IMAGE SENSOR

CROSS REFERENCE TO RELATED APPLICATIONS

This application claims priority to and the benefit of Korean Patent Application No. 10-2009-0062648 filed in the Korean Intellectual Property Office on Jul. 9, 2009, the entire disclosure of which is incorporated herein by reference.

FIELD OF THE INVENTION

The present invention relates to an organic-inorganic hybrid composition having a high refractive index and transmittance and an image sensor.

BACKGROUND OF THE INVENTION

An image sensor is a device including several million photoelectric conversion devices, and transforms light into an electric signal depending upon the intensity of the radiation when it receives the light. The image sensor is installed in a digital input device that enables an image to be digitalized to transfer the digital image. Recently, the need for these devices has significantly increased for various security devices and portable digital devices.

The image sensor includes a pixel array in which a plurality of pixels are arranged in a matrix form, and each pixel includes a photo-sensing device and a transmitting and signal output device. The image sensor can be broadly classified as a charge coupled device (CCD) image sensor or a complementary metal oxide semiconductor (CMOS) image sensor, depending upon the transmitting and signal output device. The CMOS image sensor concentrates outside light through a microlens, the concentrated light is transmitted to a photo-sensing device such as a photodiode, and the signal is output.

The CMOS image sensor is further refined to accomplish higher resolution, and recently research has focused on decreasing the pixel size to 1 µm or less. It is necessary to consider the geometric optic and wave optic aspects in relation to the microlens due to the small pixel size of 1 µm or less, since the size of the unit pixel reaches up to about 1.5 times the visible ray wavelength. Further, as the unit pixel becomes smaller, the diameter of the microlens becomes smaller. Accordingly, the crosstalk phenomenon with an adjacent pixel more easily occurs unless the focal distance of the lens is decreased, and as a result the resolution is deteriorated. In order to solve this problem, it has been suggested that the thickness of each layer formed between the photodiode and the microlens should be decreased.

SUMMARY OF THE INVENTION

One aspect of the present invention provides an organic-inorganic hybrid composition that can have a high refractive index and excellent transmittance.

Another aspect of the present invention provides a high resolution image sensor having improved sensitivity by using the organic-inorganic hybrid composition.

According to one aspect of the present invention, an organic-inorganic hybrid composition is provided that includes (A) a fluorene-based monomer, (B) an inorganic particle, (C) an initiator, and (D) a solvent.

The fluorene-based monomer (A) is represented by the following Chemical Formula 1.

[Chemical Formula 1]

In the above Chemical Formula 1, $Y_1$ and $Y_2$ each independently comprises substituted or unsubstituted C1 to C10 methacrylate group, substituted or unsubstituted C1 to C10 epoxy group, or substituted or unsubstituted C1 to C10 isocyanate group, $R_1$ and $R_2$ each independently comprises substituted or unsubstituted C1 to C10 alkylene, substituted or unsubstituted C2 to C10 alkenylene, substituted or unsubstituted C2 to C10 alkynylene, substituted or unsubstituted C4 to C20 arylene, substituted or unsubstituted C1 to C10 alkoxylene, substituted or unsubstituted C1 to C10 heteroalkylene, substituted or unsubstituted C2 to C10 heteroalkenylene, substituted or unsubstituted C2 to C10 heteroalkynylene, substituted or unsubstituted C3 to C20 heteroarylene, substituted or unsubstituted C5 to C20 arylalkylene, substituted or unsubstituted C1 to C10 alkanol, substituted or unsubstituted C1 to C10 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to C20 cycloalkylene, substituted or unsubstituted C3 to C20 cycloalkenylene, substituted or unsubstituted C3 to C20 cycloalkynylene, substituted or unsubstituted C1 to C20 heterocycloalkylene, substituted or unsubstituted C2 to C20 heterocycloalkenylene, or substituted or unsubstituted C2 to C10 heterocycloalkynylene, and $X_1$ to $X_8$ each independently comprises hydrogen, halogen, substituted or unsubstituted C1 to C10 alkyl, substituted or unsubstituted C2 to C10 alkenyl, substituted or unsubstituted C2 to C10 alkynyl, substituted or unsubstituted C4 to C20 aryl, substituted or unsubstituted C1 to C10 alkoxy, substituted or unsubstituted C1 to C10 heteroalkyl, substituted or unsubstituted C2 to C10 heteroalkenyl, substituted or unsubstituted C2 to C10 heteroalkynyl, substituted or unsubstituted C3 to C20 heteroaryl, substituted or unsubstituted C5 to C20 arylalkyl, substituted or unsubstituted C1 to C10 alkanol, substituted or unsubstituted C5 to C20 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to C20 cycloalkyl, substituted or unsubstituted C3 to C20 cycloalkenyl, substituted or unsubstituted C3 to C20 cycloalkynyl, substituted or unsubstituted C1 to C20 heterocycloalkyl, substituted or unsubstituted C2 to C20 heterocycloalkenyl, or substituted or unsubstituted C2 to C10 heterocycloalkynyl.

The organic-inorganic hybrid composition may have a refractive index of about 1.65 to about 1.9 for light having a wavelength of about 633 nm.

When the organic-inorganic hybrid composition produces a film having a thickness of about 1 µm, the transmittance may range from about 85 to about 99% for light having a wavelength of about 400 to about 800 nm.

Examples of the (B) inorganic particle may include without limitation titanium oxide, zinc oxide, zirconium oxide, antimony tin oxide, and a combination thereof having a primary particle diameter of about 5 to about 70 nm.

Examples of the initiator (C) include without limitation a photopolymerization initiator, a thermal polymerization initiator, and a combination thereof.

The organic-inorganic hybrid composition includes (A) about 1 to about 80 wt % of the fluorene-based monomer, (B) about 1 to about 50 wt % of the inorganic particle, (C) about 0.01 to about 10 wt % of the initiator, and (D) the balance of the solvent.

The organic-inorganic hybrid composition may further include (E) a dispersing agent.

According to one aspect of the invention, an image sensor is provided that includes a photo-sensing device, a color filter positioned on the photo-sensing device, a microlens positioned on the color filter, an insulation layer positioned between the photo-sensing device and the color filter and including a trench pattern partially exposing the photo-sensing device, and a filler filled in the trench. The filler is a cured product of the organic-inorganic hybrid composition. The filler can have a higher refractive index than that of the insulation layer.

The organic-inorganic hybrid composition according to one embodiment can have a high refractive index and excellent transmittance so as to minimize the light loss. The image sensor obtained using the organic-inorganic hybrid composition can increase the light concentrating efficiency to enable a photodiode to sense more light. Accordingly, it is possible to accomplish a high resolution image sensor having improved sensitivity.

DETAILED DESCRIPTION OF THE INVENTION

The present disclosure will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout the specification.

As used herein, when a definition is not otherwise provided, the term "substituted" refers to one substituted with one or more substituents comprising a halogen (F, Br, Cl, or I), a hydroxy, a nitro, a cyano, an amino, an azido, an amidino, a hydrazino, a hydrazono, a carbonyl, a carbamyl, a thiol, an ester, a carboxyl or a salt thereof, sulfonic acid or a salt thereof, phosphoric acid or a salt thereof, a substituted or unsubstituted C1 to C30 alkyl, a substituted or unsubstituted C2 to C30 alkenyl, a substituted or unsubstituted C2 to C30 alkynyl, a substituted or unsubstituted C6 to C30 aryl, a substituted or unsubstituted C1 to C30 alkoxy, a substituted or unsubstituted C7 to C30 arylalkyl, a substituted or unsubstituted C1 to C30 heteroalkyl, a substituted or unsubstituted C2 to C30 heteroalkenyl, a substituted or unsubstituted C2 to C30 heteroalkynyl, a substituted or unsubstituted C3 to C30 heteroaryl, a substituted or unsubstituted C3 to C30 heteroarylalkyl, a substituted or unsubstituted C3 to C30 cycloalkyl, a substituted or unsubstituted C3 to C30 cycloalkenyl, a substituted or unsubstituted C3 to C30 cycloalkynyl, a substituted or unsubstituted C1 to C30 heterocycloalkyl, a substituted or unsubstituted C2 to C30 heterocycloalkenyl, a substituted or unsubstituted C2 to C30 heterocycloalkynyl, or a combination thereof.

As used herein, when a definition is not otherwise provided, the term "hetero" refers to one including one or more heteroatoms comprising N, O, S, P, or a combination thereof.

In the drawings, the thickness of layers, films, panels, regions, and the like, are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The organic-inorganic hybrid composition according to one embodiment includes (A) a fluorene-based monomer, (B) an inorganic particle, (C) an initiator, and (D) a solvent. The composition may further include (E) a dispersing agent.

Hereinafter, each component is described in more detail.

(A) Fluorene-Based Monomer

The organic-inorganic hybrid composition having a high refractive index and transmittance includes a fluorene-based monomer.

The fluorene-based monomer is represented by the following Chemical Formula 1.

[Chemical Formula 1]

In the above Chemical Formula 1, $Y_1$ and $Y_2$ each independently comprises substituted or unsubstituted C1 to C10 acrylate group, substituted or unsubstituted C1 to C10 methacrylate group, substituted or unsubstituted C1 to C10 epoxy group, or substituted or unsubstituted C1 to C10 isocyanate group.

$R_1$ and $R_2$ each independently comprises substituted or unsubstituted C1 to C10 alkylene, substituted or unsubstituted C2 to C10 alkenylene, substituted or unsubstituted C2 to C10 alkynylene, substituted or unsubstituted C4 to C20 arylene, substituted or unsubstituted C1 to C10 alkoxylene, substituted or unsubstituted C1 to C10 heteroalkylene, substituted or unsubstituted C2 to C10 heteroalkenylene, substituted or unsubstituted C2 to C10 heteroalkynylene, substituted or unsubstituted C3 to C20 heteroarylene, substituted or unsubstituted C5 to C20 arylalkylene, substituted or unsubstituted C1 to C10 alkanol, substituted or unsubstituted C1 to C10 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to C20 cycloalkylene, substituted or unsubstituted C3 to C20 cycloalkenylene, substituted or unsubstituted C3 to C20 cycloalkynylene, substituted or unsubstituted C1 to C20 heterocycloalkylene, substituted or unsubstituted C2 to C20 heterocycloalkenylene, or substituted or unsubstituted C2 to C10 heterocycloalkynylene, and in one embodiment, comprises substituted or substituted C1 to C10 arylalcohol, substituted or unsubstituted C4 to C20 arylamino, substituted or unsubstituted C4 to C20 arylthiol, or substituted or unsubstituted C1 to C10 alkoxylene, and in another embodiment comprises substituted or unsubstituted C1 to C10 alkoxyamino.

$X_1$ to $X_8$ each independently comprises hydrogen, halogen, substituted or unsubstituted C1 to C10 alkyl, substituted or unsubstituted C2 to C10 alkenyl, substituted or unsubstituted C2 to C10 alkynyl, substituted or unsubstituted C4 to C20 aryl, substituted or unsubstituted C1 to C10 alkoxy, substituted or unsubstituted C1 to C10 heteroalkyl, substituted or unsubstituted C2 to C10 heteroalkenyl, substituted or unsubstituted C2 to C10 heteroalkynyl, substituted or unsubstituted C3 to C20 heteroaryl, substituted or unsubstituted C5 to C20 arylalkyl, substituted or unsubstituted C1 to C10 alkanol, substituted or unsubstituted C5 to C20 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to C20 cycloalkyl, substituted or unsubstituted C3 to C20 cycloalkenyl, substituted or unsubstituted C3 to C20 cycloalkynyl, substituted or unsubstituted C1 to C20 heterocycloalkyl, substituted or unsubstituted C2 to C20 heterocycloalkenyl, or substituted or unsubstituted C2 to C10 heterocycloalkynyl, and in one embodiment, comprises hydrogen, halogen, substituted or unsubstituted C1 to C10 alkyl, substituted or unsubstituted C4 to C20 aryl, or substituted or unsubstituted C1 to C10 alkoxy.

The fluorene-based monomer may be included in an amount of about 1 to about 80 wt % or, for example, about 5 to about 50 wt %, based on the total weight of the organic-inorganic hybrid composition. When the fluorene-based monomer is included in an amount within this range, it is possible to provide a high refractive index, high transmittance, and a suitable viscosity, so the physical and optical characteristics can be improved when it is used in a device.

(B) Inorganic Particle

The inorganic particle may have a primary particle diameter of about 5 to about 70 nm. The skilled artisan will understand the meaning of the term primary particle diameter, which refers to a size of the particle obtained during preparing the particle and a minimum size that is capable of being dispersed. When the inorganic particle has a primary particle diameter within this range, it is possible to increase transmittance to more than that of the same material having a primary particle diameter outside the range. However, if the primary particle diameter is too small, even though the transmittance is increased, the durability and the refractive index may be deteriorated.

Exemplary inorganic particles include without limitation titanium oxide, zinc oxide, zirconium oxide, antimony tin oxide, and the like, and combinations thereof.

According to one embodiment, the inorganic particle is included in an amount of about 1 to about 50 wt % or, for example, about 3 to about 30 wt %, based on the total weight of the organic-inorganic hybrid composition. When the inorganic particle is included in an amount within this range, it is possible to provide a high refractive index, high transmittance, and suitable viscosity. Therefore, when the organic-inorgainc hydrid composition is used in a device, it may have excellent physical and optical characteristics.

(C) Initiator

The initiator initiates polymerization of the fluorene-based monomer of the above Chemical Formula 1. Exemplary initiators include without limitation photopolymerization initiators, thermal polymerization initiator, and the like and combinations thereof.

Exemplary photopolymerization initiators include without limitation acetophenone-based compounds, benzophenone-based compounds, thioxanthone-based compounds, benzoin-based compounds, triazine-based compounds, oxime-based compounds, and the like, and combinations thereof.

Exemplary acetophenone-based compounds may include without limitation 2,2'-diethoxyacetophenone, 2,2'-dibutoxyacetophenone, 2-hydroxy-2-methylfluorophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Exemplary benzophenone-based compounds may include without limitation benzophenone, benzoyl benzoic acid, benzoyl benzoic acid methyl, 4-phenyl benzophenone, hydroxy benzophenone, acrylic benzophenone, 4,4'-bis(dimethylamino)benzophenone, 4,4'-bis(diethylamino)benzophenone, 4,4'-dichlorobenzophenone, 3,3'-dimethyl-2-methoxybenzophenone, and the like, and combinations thereof.

Exemplary thioxanthone-based compounds may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Exemplary benzoin-based compounds may include without limitation benzoin, benzoin methyl ether, benzoin ethyl ether, benzoin isopropyl ether, benzoin isobutyl ether, benzyldimethylketal, and the like and combinations thereof.

Exemplary triazine-based compounds may include without limitation 2,4,6-trichloro s-triazine, 2-phenyl4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl4,6-bis(trichloromethyl)-s-triazine, bis(trichloromethyl)-6-styryls-triazine, 2-(naphto1-yl)-4,6-bis(trichloromethyl)-s-triazine, 2-(4-methoxynaphto1-yl)-4,6-bis(trichloromethyl)-s-triazine, 2-4-trichloromethyl(piperonyl)-6-triazine, 2-4-trichloro methyl (4'-methoxystyryl)-6-triazine, 2-piperonyl-4,6-bis(trichloromethyl)-1,3,5-triazine, and the like and combinations thereof.

Exemplary oxime-based compounds may include without limitation 2-(o-benzoyloxime)-1-[4-(phenylthio)phenyl]-1, 2-octanedione, 1-(o-acetyloxime)-1-[9-ethyl-6-(2-methylbenzoyl)-9H-carbazol-3-yl]ethanone, and the like and combinations thereof.

Exemplary photopolymerization initiators may include without limitation carbazole-based compounds, diketone-based compounds, sulfonium borate-based compounds, diazo-based compounds, non-imidazole-based compounds, and the like, and combinations thereof, other than or in addition to the above photopolymerization initiators.

Exemplary thermal polymerization initiators include without limitation radical polymerization initiators including peroxide initiators such as butyl peroxide, dicumyl peroxide, and the like, azobis-based initiators such as azobisisobutyronitrile (AIBN), and the like, and combinations thereof.

The initiator may be included in an amount of about 0.01 to about 10 wt %, and in one embodiment, about 0.05 to about 5 wt %, based on the total weight of the organic-inorganic hybrid composition. When the initiator is included in an amount in the above range, physical and optical characteristics can be improved due to excellent sensitivity.

(D) Solvent

The solvent is not particularly limited, and may be used singularly or as a mixture of two or more.

Exemplary solvents may include without limitation alcohol compounds such as methanol, ethanol, and the like; ether compounds such as dichloroethyl ether, n-butyl ether, diisoamyl ether, methylphenyl ether, tetrahydrofuran, and the like; glycol ether compounds such as ethylene glycol monomethylether, ethylene glycol monoethylether, and the like; cellosolve acetate compounds such as methyl cellosolve acetate, ethyl cellosolve acetate, diethyl cellosolve acetate, and the like; carbitol compounds such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetate compounds such as propylene glycol methylethyl acetate, propylene glycol methylether acetate, propylene glycol propylether acetate, and the like; aromatic hydrocarbon compounds such as toluene, xylene, and the like; ketone compounds such as methyl ethyl ketone, cyclohexanone, 4-hydroxy-4-methyl-2-pentanone, methyl-n-propyl ketone, methyl-n-butyl ketone, methyl-n-amyl ketone, 2-heptanone, and the like; saturated aliphatic monocarboxylic acid alkyl ester compounds such as ethyl acetate, acetic acid-n-butyl, acetic acid isobutyl, and the like; lactic acid ester compounds such as methyl lactate, ethyl lactate, and the like; oxy acetic acid alkyl ester compounds such as oxy methyl acetate, oxy ethyl acetate, oxy butyl acetate, and the like; alkoxy acetic acid alkyl ester compounds such as methoxy methyl acetate, methoxy ethyl acetate, methoxy butyl acetate, ethoxy methyl acetate, ethoxy ethyl acetate, and the like; 3-oxy propionic acid alkyl ester compounds such as 3-oxy methyl propionate, 3-oxy ethyl propionate, and the like; 3-alkoxy propionic acid alkyl ester compounds such as 3-methoxy methyl propionate, 3-methoxy ethyl propionate, 3-ethoxy ethyl propionate, 3-ethoxy methyl propionate, and the like; 2-oxy propionic acid alkyl ester compounds such as 2-oxy methyl propionate, 2-oxy ethyl propionate, 2-oxy propyl propionate, and the like; 2-alkoxy propionic acid alkyl ester compounds such as 2-methoxy methyl propionate, 2-methoxy ethyl propionate, 2-ethoxy ethyl propionate, 2-ethoxy methyl propionate, and the like; 2-oxy-2-methyl propionic acid alkyl ester compounds such as 2-oxy-2-methyl methyl propionate, 2-oxy-2-methyl ethyl propionate, and the like; monooxy monocarboxylic acid alkyl ester compounds of 2-alkoxy-2-methyl propionic acid alkyl such as 2-methoxy-2-methyl methyl propionate, 2-ethoxy-2-methyl ethyl propionate, and the like; ester compounds such as 2-hydroxy ethyl propionate, 2-hydroxy-2-methyl ethyl propionate, hydroxy ethyl acetate, 2-hydroxy-3-methyl methyl butanoate, and the like; ketonic acid ester compounds such as ethyl pyruvate and the like; N-methyl formamide; N,N-dimethyl formamide; N-methyl formanilide; N-methyl acetamide; N,N-dimethyl acetamide; N-methyl pyrrolidone; dimethyl sulfoxide; benzyl ethyl ether; dihexyl ether; acetyl acetone; isophorone; caproic acid; caprylic acid; 1-octanol; 1-nonanol; benzylalcohol; benzyl acetate; ethyl benzoate; diethyl oxalate; diethyl maleate; γ-butyrolactone; ethylene carbonate; propylene carbonate; phenyl cellosolve acetate; and the like, and combinations thereof.

Of the above solvents, glycol ether compounds such as ethylene glycol monoethyl ether; cellosolve acetate compounds such as ethyl cellosolve acetate; ester compounds such as 2-hydroxy ethyl propionate; carbitol compounds such as diethylene glycol monomethyl ether; and propylene glycol alkylether acetate compounds such as propylene glycol methylether acetate, propylene glycol propylether acetate, and so on may be useful in terms of compatibility and reactivity.

The amount of the solvent is not limited, and it may be controlled according to amounts of the fluorene-based monomer, inorganic particle, initiator, and other additives. In one embodiment, the solvent may be used in an amount of about 10 to about 95 wt %, and in another embodiment, about 50 to about 90 wt %, based on the total weight of the organic-inorganic hybrid composition. When the amount of the solvent is within the above range, appropriate viscosity may be obtained, thereby improving physical and optical characteristics of the resultant products.

(E) Dispersing Agent

The inorganic particle may be added in the organic-inorganic hybrid composition without any further treatment, or it may be added in a form of an inorganic particle dispersion solution.

The inorganic particle dispersion solution may have a form of a dispersion in which the inorganic particle and the monomer represented by above Chemical Formula 1 are dispersed in a solvent using a dispersing agent.

Exemplary dispersing agents may include without limitation Disperbyk 110, Disperbyk 111, Disperbyk 160, Disperbyk 161, Disperbyk 162, Disperbyk 163, Disperbyk 164, Disperbyk 165, Disperbyk 180, Disperbyk 181, Disperbyk 182, Disperbyk 2000, Disperbyk 2001, Disperbyk 2009, Disperbyk 2010, Disperbyk 2015, Disperbyk 2020, Disperbyk 2050, Disperbyk 2070, Disperbyk 2090, Disperbyk 2163, and the like and combinations thereof.

The dispersing agent may be included in an amount of about 0.1 to about 30 wt %, or, for example, about 0.5 to about 10 wt %, based on the total weight of the organic-inorganic hybrid composition. When the dispersing agent is included in an amount within this range, it is possible to secure dispersion stability of the inorganic particle and to provide a suitable viscosity, so that a device including the same can have excellent physical and optical characteristics.

(F) Other Additives

Besides the components of (A) to (E), the organic-inorganic hybrid composition may further include one or more other additives, for example, for preventing stains and spots during the coating process, for controlling the leveling property, and/or for preventing undeveloped residue.

Examples of the additive include without limitation malonic acid, 3-amino-1,2-propanediol, a silane-based coupling agent including a vinyl group or a (meth)acryloxy group, a fluorine-based surfactant, and the like and combinations thereof. The amount of the additive may be controlled in accordance with the desirable properties to be obtained, and the skilled artisan will appreciate amounts of additives useful in the invention without undue experimentation.

The organic-inorganic hybrid composition may further include an epoxy compound to improve adherence and other characteristics as needed. Examples of the epoxy compound include without limitation an epoxy novolac acryl carboxylate resin, an ortho cresol novolac epoxy resin, a phenol novolac epoxy resin, a tetra methyl biphenyl epoxy resin, a bisphenol A epoxy resin, an alicyclic epoxy resin, and the like and combinations thereof. The epoxy compound may be included in an amount of about 0.01 to about 10 parts by weight based on about 100 parts by weight of the organic-inorganic hybrid composition. When the amount of the epoxy compound is in an amount within the above range, storage and adherence can be efficiently improved.

The organic-inorganic hybrid composition may further include a multi-functional photopolymerization monomer such as ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylolpropane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof. The multi-functional photopolymerization monomer can be included in a conventional amount, as will be understood by the skilled artisan.

The organic-inorganic hybrid composition including the composition may be a high refractive material and may show high transmittance in a visible ray region. In addition, the organic-inorganic hybrid composition may be sufficiently charged in the trench pattern obtained by lithography and simultaneously have excellent film planarity. The organic-inorganic hybrid composition can also have sufficient resistance to chemical materials it is exposed to during a device manufacturing process. Accordingly, the organic-inorganic hybrid composition according to one embodiment may have a refractive index of about 1.65 to about 1.9 for light having a wavelength of about 633 nm. When used to produce a film having a thickness of about 1 μm, it may have a transmittance of about 85 to about 99% for light having a wavelength of about 400 to 800 nm.

One example of a method of preparing the organic-inorganic hybrid composition includes: dissolving an initiator in a solvent and agitating at room temperature for about 1 to about 2 hours; adding a monomer and additives and agitating at room temperature for about 1 to about 2 hours; adding an inorganic particle dispersion solution to the reactant and agitating at room temperature for 30 minutes to 1 hour to dissolve; and filtering 2 to 5 times to remove impurities. The foregoing is an exemplary method only and the skilled artisan will appreciate that the order of addition of each component and the process conditions may vary.

Hereinafter, an image sensor according to another embodiment is described.

The image sensor according to one embodiment includes a photo-sensing device, a color filter positioned on the photo-sensing device, a microlens positioned on the color filter, an insulation layer positioned between the photo-sensing device and the color filter and including a trench pattern partially exposing the photo-sensing device, and a filler filled in the trench. The filler is a cured product of the organic-inorganic hybrid composition.

The trench pattern may be formed by performing lithography on the insulation layer after providing a photo-sensing device and a metal wire, or by thermal-curing or photo-curing the organic-inorganic hybrid composition according to one embodiment which is a filler included in the trench pattern to provide a plane layer.

Hereinafter, referring to FIGS. 1 and 2, an image sensor according to one embodiment is described.

Figure 1:
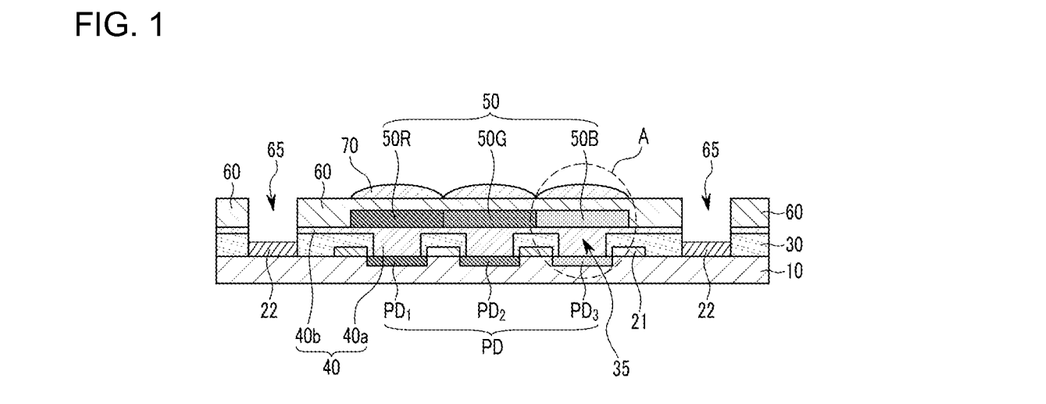
FIG. 1 is a cross-sectional view of a CMOS image sensor according to one embodiment.

FIG. 1 is a schematic cross-sectional view of a CMOS image sensor according to one embodiment.

In FIG. 1, a red pixel, a green pixel, and a blue pixel adjacent to each other are exemplary described, but are not limited thereto.

Referring to FIG. 1, the photo-sensing device (PD) and transmitting transistor (not shown) are integrated on a semiconductor substrate 10. The photo-sensing device (PD) may include a photodiode. The photo-sensing device (PD) and the transmitting transistor are integrated in each pixel. As shown in the drawing, the photo-sensing device (PD) includes a photo-sensing device (PD1) of a red pixel, a photo-sensing device (PD2) of a green pixel, and a photo-sensing device (PD3) of a blue pixel. The photo-sensing device (PD) senses the light, and the information sensed by the photo-sensing device (PD) is transferred to the transmitting transistor.

In addition, a metal line 21 and a pad 22 are formed on the substrate 10. The metal line 21 and the pad 22 may be made of a metal having low resistivity such as aluminum (Al), copper (Cu), silver (Ag), or an alloy thereof to decrease the signal delay.

A lower insulation layer 30 is formed on the metal line 21 and the pad 22. The lower insulation layer 30 may be made of an inorganic insulating material such as silicon oxide ($SiO_2$), or a low dielectric constant (low-k) material such as SiC, SiCOH, SiCO, or SiOF.

The lower insulation layer 30 has a trench 35 exposing each photo-sensing device PD1, PD2, and PD3 of each pixel. The trench 35 is formed to provide an aspect ratio of about 1.8 to about 4, and for example, it may have a width of about 0.5 to about 0.8 μm and a height of about about 1.5 to about 2 μm. The trench 35 is formed to provide a width of about 0.8 to about 1.2 times that of each photo-sensing device PD1, PD2, and PD3 of the pixel in order to prevent light crosstalk and to effectively sense light.

A filler 40 is formed in the trench 35. The filler 40 includes a thick portion 40a filling each trench 40 and a thin portion 40b formed on the insulation layer 30. However, the thin portion 40b of the filler 40 may be removed depending upon the manufacturing method.

The filler 40 has a higher refractive index than the insulation layer 30. For example, the filler 40 may have a refractive index of about 1.1 to about 1.5 times that of the insulation layer 30. For example, when the insulation layer 30 includes silicon oxide having a refractive index of 1.45 to 1.5, the filler 40 may have a refractive index of 1.65 to 1.9.

In addition, when the filler 40 is used for making a film having a thickness of about 1 μm, it may have transmittance of about 85 to about 99% for light having a wavelength of about 400 to about 800 nm.

The filler 40 having a high refractive index and high light transmittance may include a polymer obtained by curing the organic-inorganic hybrid composition.

A color filter 50 is positioned on the filler 40. The color filter 50 includes a red filter 50R formed on the red pixel, a green filter 50G formed on the green pixel, and a blue filter 50B formed on the blue pixel. The red filter 50R, the green filter 50G, and the blue filter 50B are respectively positioned on a photo-sensing device PD1 of a red pixel, a photo-sensing device PD2 of a green pixel, and a photo-sensing device PD3 of a blue pixel.

An upper insulation layer 60 is formed on the color filter 50. The upper insulation layer 60 removes a step due to the color filter 50 and planarizes the same. The upper insulation layer 60 and the lower insulation layer 30 have a contact hole 65 exposing the pad 22.

A microlens 70 is formed on the upper insulation layer 60 in the position corresponding to each color filter 50R, 50G, and 50B of the pixels. The microlens 70 concentrates light coming from the outside.

Figure 2:
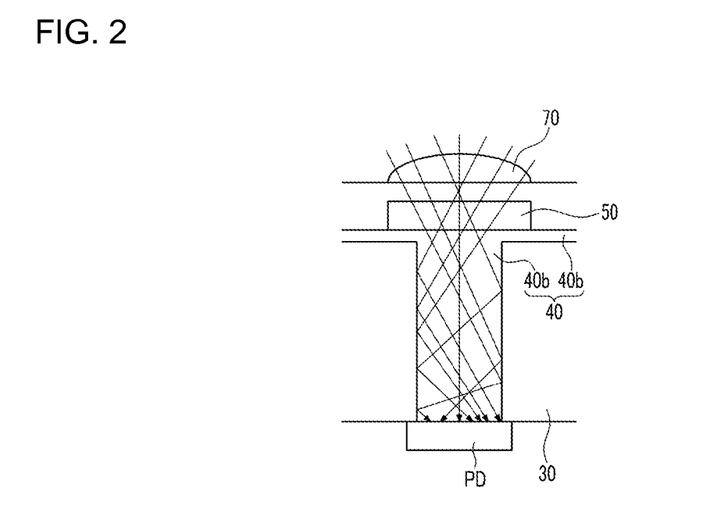
FIG. 2 is a schematic diagram enlarging the "A" portion of the image sensor of FIG. 1.

Referring to FIG. 2, the principal of the image sensor according to one embodiment is schematically described.

FIG. 2 is a schematic diagram enlarging the "A" portion of the image sensor of FIG. 1.

The "A" portion of FIG. 1 refers to a unit cell of an image sensor.

Referring to FIG. 2, the light concentrated from the microlens 70 is passed through the color filter 50 and then reflected several times in the trench 35 by total reflection, so it is gathered into a photo-sensing device (PD). The total reflection is generated by a refractive index difference between the filler 40 and the insulation layer 30. When the reflective index difference is increased, the total reflection is more effective.

The light concentrated from the microlens 70 in the unit pixel flows into a photo-sensing device (PD) positioned in the pixel through the total reflection, so the light concentrating efficiency is increased to prevent light leakage to an adjacent pixel. Accordingly, it is possible to provide an image sensor having high resolution.

Furthermore, it prevents the light loss by the filler 40 that is filled in the trench 35 and has high light transmittance of about 85% or more, so the light sensing efficiency of the photo-sensing device is increased.

The method of manufacturing the CMOS image sensor shown in FIG. 1 is now described.

First, a photo-sensing device (PD) is formed on each pixel of the semiconductor substrate 10, and a metal line 21 and a pad 22 having a predetermined pattern are arrayed thereon. Then a lower insulation layer 30 is formed on the front surface of the substrate. A trench 35 is formed on the lower insulation layer 30 to expose each photo-sensing device PD1, PD2, and PD3. Subsequently, the organic-inorganic hybrid composition is coated on the substrate and cured to provide a filler 40. The curing process may be performed in accordance with photo-curing, thermal-curing or the like. In the case of a thermal-curing process, it may be performed by baking at about 200 to about 300° C. for about 120 to about 180 seconds.

The filler can have a high refractive index of about 1.65 to about 1.9 for light having a wavelength of about 633 nm. Simultaneously, when it is produced into a film having a thickness of about 1 μm, it can have a high transmittance of about 85 to about 99% for light having a wavelength of about 400 to about 800 nm. The refractive index and the light transmittance are considered as substantially equivalent both when the filler is in a liquid state and a cured state. In addition, since the filler can have an excellent filling property for a trench having a high aspect ratio, it is possible to fill a fine trench and to provide excellent flatness (planarity).

After the filler 40 and lower insulation layer 30 are partially removed to expose a pad 22, a pad protective layer (not illustrated) covering the pad 22 is provided. Each color filter 50R, 50G, and 50B is respectively formed on the filler 40 in a position corresponding to each photo-sensing device PD1, PD2, and PD3. Then an upper insulation layer 60 is formed thereon, and a microlens 70 is provided on each color filter 50R, 50G, and 50B.

The image sensor provided according to the above method using the organic-inorganic hybrid composition can have improved light-concentration efficiency.

Hereinafter, the embodiments are illustrated in more detail with reference to examples. However, the following are exemplary embodiments and are not limiting.

Fluorene-Based Monomer Synthesis

Synthesis Example 1

9,9'-bis(4-oxyranylmethoxyphenyl)fluorene

| | |
|---|---|
| 9,9'-bis(4-hydroxyphenyl)fluorine (Aldrich) | 40 g |
| Epichlorohydrin (Aldrich) | 36 g |
| Triethylamine (Daejung Chemicals & Metals Co., Ltd.) | 46 g |
| 1,4-dioxane (Daejung Chemicals & Metals Co., Ltd.) | 300 g |

9,9'-bis(4-hydroxyphenyl)fluorene, epichlorohydrin, and 1,4-dioxane are introduced into a reactor and agitated, and heated to 60° C., and then triethylamine is added in a dropwise fashion for 30 minutes. After adding the triethylamine, the temperature is maintained for 4 hours and cooled to room temperature. After filtering the triethylamine salt, the filtrate is added to 1 L of water in a dropwise fashion for 30 minutes to provide a solid. The obtained solid is filtered to provide 41 g of 9,9'-bis(4-oxiranylmethoxyphenyl)fluorene.

Synthesis Example 2

Preparing Compound Represented by Chemical Formula 2

| | |
|---|---|
| 9,9'-bis(4-oxiranylmethoxyphenyl)fluorine (Synthesis Example 1) | 20 g |
| Methacrylic acid (Aldrich) | 100 g |
| Triethylamine (Daejung Chemicals & Metals Co., Ltd.) | 24 g |
| 1,4-dioxane (Daejung Chemicals & Metals Co., Ltd.) | 50 g |
| n-hexane (Daejung Chemicals & Metals Co., Ltd.) | 200 g |

9,9'-bis(4-oxiranylmethoxyphenyl)fluorene, methacrylic acid, and 1,4-dioxane are introduced into a reactor and agitated, and heated to 80° C., and then triethylamine is added in a dropwise fashion for 30 minutes. After adding the triethylamine, the temperature is maintained for 4 hours and cooled to room temperature. After filtering triethylamine salt, the filtrate is added to 200 g of n-hexane in a dropwise fashion to provide a solid. The solid is filtered to provide 14 g of a compound represented by the following Chemical Formula 2.

[Chemical Formula 2]

Preparation of Inorganic Particle Dispersion Solution

Preparation Example 1

Components are mixed in accordance with the composition shown in the following Table 1 and dispersed for 12 hours using a paint shaker (manufactured by Asada company) to provide an inorganic particle dispersion solution.

TABLE 1

| Material (manufacturer, trade name) | Amount [wt %] |
|---|---|
| Titanium oxide (Ishihara, TTO-51 A) | 15 |
| Monomer of the above Chemical Formula 2 | 5 |
| Dispersing agent (BYK, Disperbyk 2020) | 4 |
| Propylene glycol methylethyl acetate | 76 |

Preparation Example 2

An inorganic particle dispersion solution is prepared in accordance with the same procedure as in Preparation Example 1, except that zinc oxide (manufactured by Sumitomo Osaka Cement, ZnO-310) is used instead of titanium oxide.

Preparation Example 3

An inorganic particle dispersion solution is prepared in accordance with the same procedure as in Preparation Example 1, except that zirconium oxide (manufactured by Sukgyung AT, $ZrO_2$) is used instead of titanium oxide.

Preparation Example 4

An inorganic particle dispersion solution is prepared in accordance with the same procedure as in Preparation Example 1, except that antimony tin oxide (manufactured by Ishihara, SN100P) is used instead of titanium oxide.

Preparation of Organic-Inorganic Hybrid Composition

Example 1

An organic-inorganic hybrid composition is prepared in accordance with the following method using the composition shown in the following Table 2.

TABLE 2

| Material (manufacturer, trade name) | Amount [wt %] |
|---|---|
| Monomer of Chemical Formula 2 | 15 |
| Inorganic particle dispersion solution of Preparation Example 1 | 50 |
| Triazine-based initiator (NIPPON KAYAKU Co. Ltd., TPP) | 1 |
| Propylene glycol methylethylacetate | 30 |
| Multi-functional photopolymerization monomer (DONGYANG SYNTHESIS Co. Ltd., DPHA) | 4 |

A triazine-based initiator is dissolved in propylene glycol methylethyl acetate and then agitated at room temperature for 30 minutes. The monomer represented by Chemical Formula 2 and a multi-functional photopolymerization monomer are added thereto and agitated at room temperature for 30 minutes. The inorganic particle dispersion solution obtained from Preparation Example 1 is introduced thereto and agitated at room temperature for one hour, and then filtered once.

Example 2

An organic-inorganic hybrid composition is prepared in accordance with the same procedure as in Example 1, except that the inorganic particle dispersion solution obtained from Preparation Example 2 is used instead of the inorganic particle dispersion solution obtained from Preparation Example 1.

Example 3

An organic-inorganic hybrid composition is prepared in accordance with the same procedure as in Example 1, except that the inorganic particle dispersion solution obtained from Preparation Example 3 is used instead of the inorganic particle dispersion solution obtained from Preparation Example 1.

Example 4

An organic-inorganic hybrid composition is prepared in accordance with the same procedure as in Example 1, except that the inorganic particle dispersion solution obtained from Preparation Example 4 is used instead of the inorganic particle dispersion solution obtained from Preparation Example 1.

Comparative Example 1

Using the composition shown in the following Table 3, a polymethylmethacrylate (PMMA) resin composition is prepared in accordance with the following method.

TABLE 3

| Material (manufacturer, trade name) | Amount [wt %] |
|---|---|
| PMMA (Aldrich, Mw = 93,000) | 20 |
| Triazine-based initiator (NIPPON KAYAKU Co. Ltd., TPP) | 1 |
| Propylene glycol methylethyl acetate | 64 |
| Multi-functional photopolymerization monomer (DONGYANG SYNTHESIS Co. Ltd., DPHA) | 15 |

A triazine-based initiator is dissolved in propyleneglycol methylethyl acetate and then agitated at room temperature for 30 minutes. PMMA and a multi-functional photopolymerization monomer are added thereto and agitated at room temperature for one hour and then filtered once.

Measuring Physical Properties 1: Measuring Refractive Index and Transmittance

Each of the organic-inorganic hybrid compositions obtained from Examples 1 to 4 and the PMMA resin composition obtained from Comparative Example 1 is spin-coated on a silicon wafer in a thickness of 0.2 μm and then cured at 200° C. for 5 minutes to provide a layer. Using an Ellipsometer, the refractive index for light having a wavelength of 633 nm is measured. Each composition is spin-coated on a glass plate in a thickness of 1 μm and cured at 200° C. for 5 minutes to provide a layer. Then transmittance is measured for light having a wavelength of 400 to 800 nm. The refractive index and transmittance results are shown in the following Table 4.

TABLE 4

|  | Refractive Index | Transmittance |
|---|---|---|
| Example 1 | 1.78 | 94 |
| Example 2 | 1.68 | 92 |
| Example 3 | 1.73 | 93 |
| Example 4 | 1.72 | 92 |
| Comparative Example 1 | 1.63 | 95 |

As shown in Table 4, the organic-inorganic hybrid composition including a monomer represented by Chemical Formula 1 maintains the transmittance within an appropriate level and has an excellent refractive index compared to that of the resin composition including the polymethylmethacrylate polymer.

Measuring Physical Properties 2: Measuring Charging Property, Planarity, and Chemical Resistance Each of the organic-inorganic hybrid compositions obtained from Examples 1 to 4 and the resin composition obtained from Comparative Example 1 is coated on a wafer for a CMOS image sensor formed with a 0.8 µm×2.0 µm trench in accordance with a spin coating method and cured at 200° C. for 5 minutes.

The filler is measured for trench filling property, film planarity, and chemical resistance. Trench filling property and film planarity are monitored using a scanning electron microscope (SEM). To indicate the results of the trench filling property, ⊚ represents that the entire trench is satisfactorily filled, ○ represents that it is partially filled, and X represents that it is not filled at all. The step of the surface is measured by atomic force microscopy (AFM) to determine film planarity, wherein ⊚ represents the case of 100 nm or less, ○ represents the case of 100 nm-1 µm, and X represents the case of 1 µm or more. The results are shown in Table 5.

The wafer is dipped into trimethylammonium hydroxide (TMAH, 2.35%), isopropyl alcohol (IPA), propylene glycol monomethyl ether acetate (PGMEA), and acetone each for 1 minute, and the thickness change is measured using a KST4000-DLX® (manufactured by KMAC) to determine the chemical resistance. The results are shown in the following Table 5.

TABLE 5

|  | Trench filling property | Planarity | Chemical resistance [thickness difference between before and after treatment, Å/min] | | | |
|---|---|---|---|---|---|---|
|  |  |  | TMAH | IPA | PGMEA | acetone |
| Example 1 | ⊚ | ⊚ | 0.3 | 0.2 | 1.2 | 0.3 |
| Example 2 | ⊚ | ○ | 0.4 | 0.3 | 0.5 | 0.8 |
| Example 3 | ⊚ | ○ | 0.3 | 0.1 | 0.9 | 1.0 |
| Example 4 | ⊚ | ○ | 0.7 | 0.5 | 1.0 | 0.7 |
| Comparative Example 1 | ○ | ⊚ | 1.3 | 1.8 | 2.8 | 1.4 |

As shown in Table 5, the layer formed using the organic-inorganic hybrid composition according to an exemplary embodiment has excellent characteristics of trench filling property, film planarity, and chemical resistance. On the other hand, the trench filling property and the film planarity are good, but the chemical resistance is poor and the refractive index is deteriorated, when the layer is formed using polymethylmethacrylate.

Measuring Physical Properties 3: Measuring Illuminance

The CMOS image sensor including a plurality of pixels having a size of about 1.7 µm is manufactured in accordance with the method of another embodiment. Each of the organic-inorganic hybrid compositions obtained from Examples 1 to 4 and the PMMA resin composition obtained from Comparative Example 1 is used therein. The illuminance of a unit pixel of the obtained CMOS image sensor is measured using a T-10M illuminometer (manufactured by Konica-Minolta), and the results are shown in the following Table 6.

TABLE 6

|  | Illuminance [lux] |
|---|---|
| Example 1 | 180 |
| Example 2 | 173 |
| Example 3 | 179 |
| Example 4 | 171 |
| Comparative Example 1 | 136 |

As shown in Table 6, when the trench is formed on the upper part of photo-sensing device of the CMOS image sensor and filled with the organic-inorganic hybrid composition according to one embodiment, the light amount flowing in each pixel is increased compared to that according to Comparative Example using a filler of polymethylmethacrylate. It is understood that the light concentrated from the microlens is passed though a filler having a high refractive index and high transmittance to the corresponding photo-sensing device, so as to increase the light efficiency This means that the light efficiency of the CMOS image sensor is increased by increasing the light efficiency sensed by the photo-sensing device of a corresponding pixel.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. An organic-inorganic hybrid composition comprising:
   (A) a fluorene-based monomer;
   (B) an inorganic particle comprising titanium oxide, zinc oxide, zirconium oxide, antimony tin oxide, or a combination thereof having a primary particle diameter of about 5 to about 70 nm;
   (C) an initiator; and
   (D) a solvent.

2. The organic-inorganic hybrid composition of claim 1, wherein the fluorene-based monomer (A) is represented by the following Chemical Formula 1:

[Chemical Formula 1]

wherein in the above Chemical Formula 1,
$Y_1$ and $Y_2$ each independently comprises substituted or unsubstituted C1 to C10 acrylate group, substituted or unsubstituted C1 to C10 methacrylate group, substituted or unsubstituted C1 to C10 epoxy group, or substituted or unsubstituted C1 to C10 isocyanate group, R₁ and R₂ each independently comprises substituted or unsubstituted C1 to C10 alkylene, substituted or unsubstituted C2 to C10 alkenylene, substituted or unsubstituted C2 to C10 alkynylene, substituted or unsubstituted C4 to C20 arylene, substituted or unsubstituted C1 to C10 alkoxylene, substituted or unsubstituted C1 to C10 heteroalkylene, substituted or unsubstituted C2 to C10 heteroalkenylene, substituted or unsubstituted C2 to C10 heteroalkynylene, substituted or unsubstituted C3 to C20 heteroarylene, substituted or unsubstituted C5 to C20 arylalkylene, substituted or unsubstituted C1 to C10 alkanol, substituted or unsubstituted C1 to C10 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to C20 cycloalkylene, substituted or unsubstituted C3 to C20 cycloalkenylene, substituted or unsubstituted C3 to C20 cycloalkynylene, substituted or unsubstituted C1 to C20 heterocycloalkylene, substituted or unsubstituted C2 to C20 heterocycloalkenylene, or substituted or unsubstituted C2 to C10 heterocycloalkynylene, X1 to X8 each independently comprises hydrogen, halogen, substituted or unsubstituted C1 to C10 alkyl, substituted or unsubstituted C2 to C10 alkenyl, substituted or unsubstituted C2 to C10 alkynyl, substituted or unsubstituted C4 to C20 aryl, substituted or unsubstituted C1 to C10 alkoxy, substituted or unsubstituted C1 to C10 heteroalkyl, substituted or unsubstituted C2 to C10 heteroalkenyl, substituted or unsubstituted C2 to C10 heteroalkynyl, substituted or unsubstituted C3 to C20 heteroaryl, substituted or unsubstituted C5 to C20 arylalkyl, substituted or unsubstituted C1 to C10 alkanol, substituted or unsubstituted C5 to C20 arylalcohol, substituted or unsubstituted C1 to C10 alkylamino, substituted or unsubstituted C4 to C20 arylamino, substituted or unsubstituted C1 to C10 alkoxyamino, substituted or unsubstituted C1 to C10 alkylthiol, substituted or unsubstituted C4 to C20 arylthiol, substituted or unsubstituted C3 to 20 cycloan alkyl, substituted or unsubstituted C3 to C20 cycloalkenyl, substituted or unsubstituted C3 to C20 cycloalkynyl, substituted or unsubstituted C1 to C20 heterocycloalkyl, substituted or unsubstituted C2 to C20 heterocycloalkenyl, or substituted or unsubstituted C2 to C10 heterocycloalkynyl.

3. The organic-inorganic hybrid composition of claim 1, wherein the composition has a refractive index of about 1.65 to about 1.9 for light having a wavelength of about 633 nm.

4. The organic-inorganic hybrid composition of claim 1, having a transmittance of about 85 to about 99% for light having a wavelength of about 400 to about 800 nm when a film having a thickness of about 1 μm is produced with the organic-inorganic hybrid composition.

5. The organic-inorganic hybrid composition of claim 1, wherein the initiator (C) comprises a photopolymerization initiator, a thermal polymerization initiator, or a combination thereof.

6. The organic-inorganic hybrid composition of claim 1, wherein the composition comprises:
   (A) about 1 to about 80 wt % of the fluorene-based monomer;
   (B) about 1 to about 50 wt % of the inorganic particle;
   (C) about 0.01 to about 10 wt % of the initiator; and
   (D) the balance of the solvent.

7. The organic-inorganic hybrid composition of claim 1, wherein the composition further comprises (E) a dispersing agent.

8. An image sensor comprising:
   a photo-sensing device;
   a color filter positioned on the photo-sensing device;
   a microlens positioned on the color filter;
   an insulation layer positioned between the photo-sensing device and the color filter and including a trench pattern partially exposing the photo-sensing device; and
   a filler filled in the trench,
   wherein the filler includes a cured product of the organic-inorganic hybrid composition according to claim 1.

9. The image sensor of claim 8, wherein the filler has a higher refractive index than that of the insulation layer.

* * * * *